United States Patent
Yamashita

(10) Patent No.: US 7,859,508 B2
(45) Date of Patent: Dec. 28, 2010

(54) LIQUID CRYSTAL DRIVING CIRCUIT AND LIQUID CRYSTAL DISPLAY DEVICE INCLUDING MULTIPLE SHIFT REGISTERS AND AN ENABLE SWITCH TO ALLOW PARTIAL DRIVING

(75) Inventor: Keitaro Yamashita, Kobe (JP)

(73) Assignee: TPO Hong Kong Holding Limited, Shatin (HK)

( * ) Notice: Subject to any disclaimer, the term of this patent is extended or adjusted under 35 U.S.C. 154(b) by 987 days.

(21) Appl. No.: 11/517,317

(22) Filed: Sep. 8, 2006

(65) Prior Publication Data
US 2007/0057899 A1 Mar. 15, 2007

(30) Foreign Application Priority Data
Sep. 9, 2005 (JP) .............................. 2005-262762

(51) Int. Cl.
G09G 3/36 (2006.01)
(52) U.S. Cl. ........................ 345/100; 345/98; 345/204; 345/205; 327/333
(58) Field of Classification Search ................. 345/100, 345/98, 204, 205; 327/333
See application file for complete search history.

(56) References Cited

U.S. PATENT DOCUMENTS

| 5,686,936 | A * | 11/1997 | Maekawa et al. | 345/100 |
| 6,064,713 | A * | 5/2000 | Lebrun et al. | 377/67 |
| 2004/0189583 | A1* | 9/2004 | Park et al. | 345/100 |
| 2004/0232952 | A1* | 11/2004 | Kimura et al. | 327/108 |
| 2005/0046619 | A1* | 3/2005 | Senda et al. | 345/76 |
| 2005/0168428 | A1* | 8/2005 | Nakajima et al. | 345/99 |

* cited by examiner

Primary Examiner—Richard Hjerpe
Assistant Examiner—Priyank Shah
(74) Attorney, Agent, or Firm—Birch, Stewart, Kolasch & Birch, LLP

(57) ABSTRACT

A liquid crystal drive circuit in which the degradation of the element is minimized in partial drive even for the GOG circuit configured by amorphous silicon, and a liquid crystal display device including the same are provided. The liquid crystal driving circuit includes a first shift register and a driving means. The first shift register advances through the line address of a pixel array to display an image, and outputs an enable signal only to drive the display target line. The driving means outputs a line drive signal corresponding to the enable signal to drive the line enabled by the first shift register.

8 Claims, 8 Drawing Sheets

LIQUID CRYSTAL DRIVING CIRCUIT AND LIQUID CRYSTAL DISPLAY DEVICE INCLUDING MULTIPLE SHIFT REGISTERS AND AN ENABLE SWITCH TO ALLOW PARTIAL DRIVING

This application claims the benefit of Japan Application Ser. No. 2005-262762, filed Sep. 9, 2005.

BACKGROUND OF THE INVENTION

1. Field of Invention

The present invention relates to a liquid crystal driving circuit and a liquid crystal display device including the same, in particular, a liquid crystal partial driving circuit configured by a TFT (Thin film transistor) gate driver made of amorphous silicon and capable of performing partial drive in standby, and a liquid crystal display device including the liquid crystal partial driving circuit.

2. Related Art

The liquid crystal display device has relatively small power consumption. But recently, further reduction in power consumption is desired particularly in the field of portable telephones and the like as a result of demand for extended operation. For example, further reduction in the power consumption is desired even in the reflection type liquid crystal display device although the reflection type liquid crystal display device originally does not use a backlight and has small power consumption.

A liquid crystal driving circuit employing a shift transistor is known to reduce power consumption and to reduce the wiring space of the liquid crystal display device to enhance space efficiency. In the liquid crystal display device, the display row is sequentially selected by the shift register, and the TFT is driven for the liquid crystal to perform the display.

Such selective drive is performed only when a signal from a previous line is input to the relevant line, and high impedance is realized using a capacitor is disclosed in U.S. Pat. No. 6,064,713. In U.S. Pat. No. 6,064,713, a bootstrap technique is also used to obtain sufficient driving voltage.

A partial drive method is proposed and put to practical use to further cut down the power by performing the display not on the entire liquid crystal display elements, but only on one part during standby.

In the partial driving method, advancement is made to the line to display, a switch arranged on the line to be selectively driven is turned ON, and the scan data is provided to the TFT.

SUMMARY OF THE INVENTION

However, such partial driving method is not achieved in a GOG (gate driver on glass) circuit in which a gate made of amorphous silicon transistor is formed on a glass substrate.

This is because degradation of the shift register configured by the amorphous silicon transistor advances when used in such a manner that gate voltage is continuously applied, whereby the threshold value varies and the image quality changes, or leads to abnormality of the operation. That is, the transistor switch arranged on the line to be partially driven needs to have the transistor turned ON by continuously applying the gate bias while being partially driven in order to perform partial drive, and thus degradation advances in proportion to the time the gate bias is applied, and normal operation cannot be guaranteed over a long period of time.

The present invention aims to provide a liquid crystal partial driving circuit in which the degradation of the element is minimized in partial drive even for the GOG circuit configured by amorphous silicon, and the liquid crystal display device applied with the same.

According to the present invention, a liquid crystal driving circuit includes a first shift register and a driving means. The first shift register advances through the line address of a pixel array to display an image, and outputs an enable signal only to drive the display target line. The driving means outputs a line drive signal corresponding to the enable signal to drive the line enabled by the first shift register.

The driving means is preferably a transistor switch, having a gate connected to an output terminal of the first shift register, for controlling the pass through of the line drive signal. Alternatively, the driving means is preferably configured by a second shift register having an enable switch. The enable switch allows scanning the line. The second shift register outputs the line drive signal for the pixel array, and the output of the enable signal of the first shift register is connected with an inner terminal.

The driving means is preferably configured by a second shift register and an enable switch. The second shift register is arranged on the opposite side of the pixel array with respect to the first shift register, wherein the output of the second shift register outputs the line drive signal for the pixel array. The enable switch is arranged on the same side as the first shift register. The enable switch is for connecting the enable signal of the first shift register to the line of the pixel array.

Therefore, according to the liquid crystal driving circuit and the liquid crystal display device of the present invention, the enable signal is output only for the display target line to be driven by the shift register. The line drive signal is provided by a separate driving means based on the enable signal. Thus, even if partial drive is performed when the driving circuit is formed by amorphous silicon, the time while high voltage is applied to the gate of each transistor is significantly shortened. Therefore, the degradation is prevented, and the extension of longer life is realized.

Each line address is not directly specified to realize partial drive, but is sequentially specified using a shift register, and thus the number of connecting lines to the outside is greatly reduced, and enhancement of yield and reduction of cost are achieved.

BRIEF DESCRIPTION OF THE DRAWINGS

The invention will become more fully understood from the detailed description given herein below illustration only, and thus is not limitative of the present invention, and wherein.

DETAILED DESCRIPTION OF THE INVENTION

The embodiments of the present invention will now be described in detail with reference to the drawings.

First Embodiment

Figure 1:
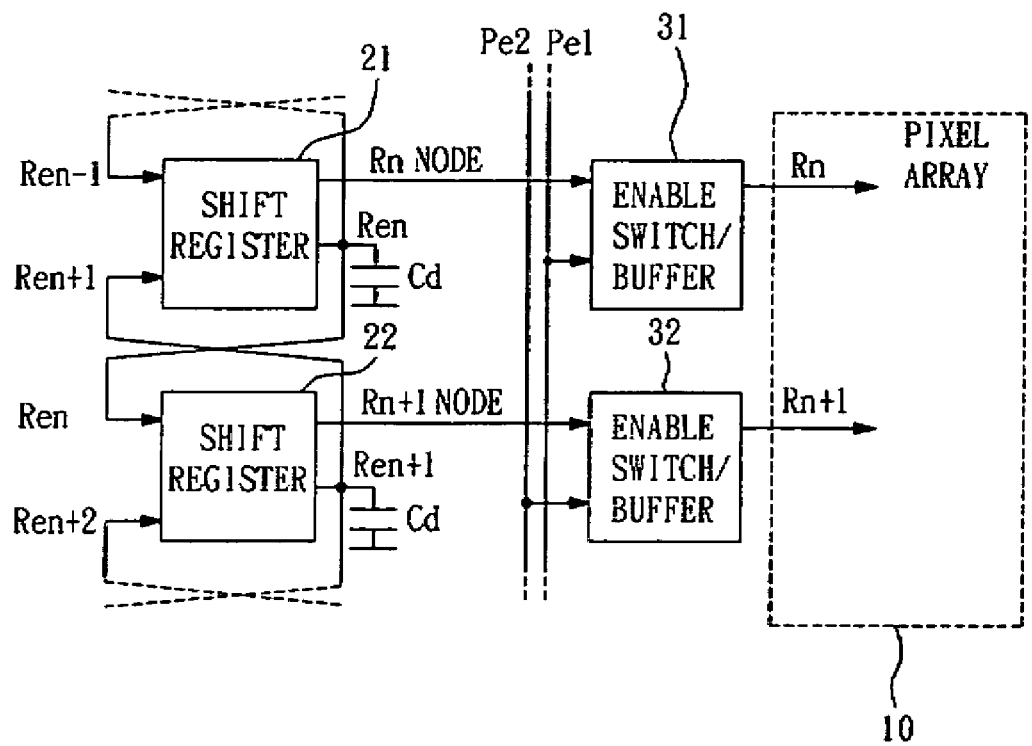
FIG. 1 is a block diagram showing a schematic configuration of a liquid crystal driving circuit according to a first embodiment of the present invention.

FIG. 1 is a simplified configuration view showing one part of the configuration according to one embodiment of a liquid crystal driving circuit of the present invention. FIG. 1 illustrates the configuration of sending the drive signal to two row lines (n and n+1) with respect to a pixel array 10. In the pixel array 10, the liquid crystal display elements are arranged in a matrix form.

With respect to line n, the signal Pe1 on an enable line is output as a signal Rn for the pixel array 10 via an enable switch/buffer 31 by the output of a shift register 21. Similarly, with respect to line n+1, the signal Pe2 on an enable line is output as a signal Rn+1 for the pixel array 10 via an enable switch/buffer 32 by the output of a shift register 22.

The shift register has the output of the node (Rn node) of the relevant line. In addition, the shift register has an enable output Ren. The enable output Ren is used to charge a dummy capacitor Cd and is input to the shift register one before and one after.

Figure 2:
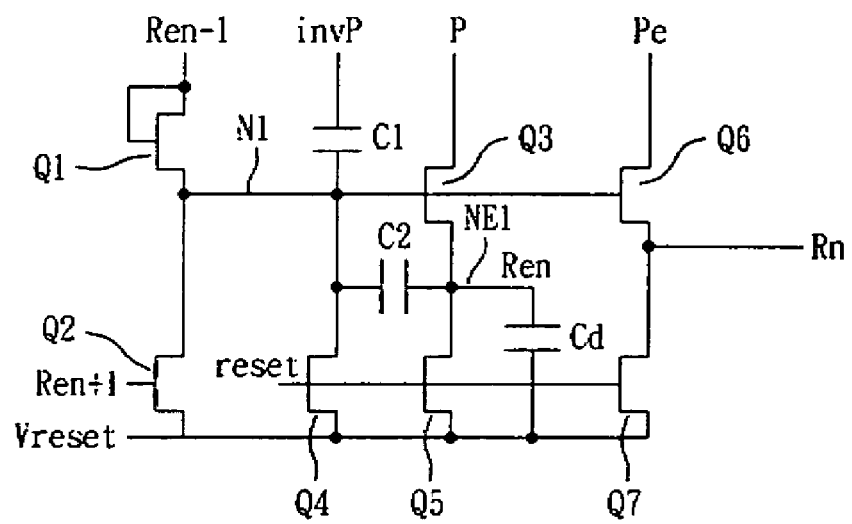
FIG. 2 is a circuit diagram showing the configuration of FIG. 1 in detail.

A specific circuit of the portion of the shift register and the enable switch/buffer is shown in FIG. 2. In the circuit diagram, explanation is made on the assumption that the transistors are all n-channel type and is made focusing on line n, but other lines also have a similar configuration.

The enable output Ren−1 of the previous line is provided to the drain of the transistor Q1 and the drain and the gate of the transistor Q1 are connected. The enable output Ren+1 of the next line is provided to the gate of the transistor Q2 and a reset level voltage Vreset is supplied to the source of the transistor Q2. The source of the transistor Q1 and the drain of the transistor Q2 are connected. The connecting node N1 is connected to one end of the two capacitors C1 and C2 and also to the gates of the transistors Q3 and Q6. The node N1 is further connected to the drain of the transistor Q4, and the source of the transistor Q4 is applied with the potential of the reset level voltage Vreset. The pulse signal P is provided to the drain of the transistor Q3, and the source of the transistor Q3 is connected to the drain of the transistor Q5. An inverted pulse signal invP is provided to the other end of the capacitor C1. The source of the transistor Q6 is connected to the drain of the transistor Q7, and the connecting point acts as the output node where the output of the signal Rn is retrieved. The reset signal is input to the gates of the transistors Q4, Q5, and Q7. The connecting point or the connecting node of the transistors Q3 and Q5 is a connecting node NE1, and is connected to the other end of the capacitor C2. An enable signal of the enable output Ren is generated at the node NE1 and a dummy capacitor Cd is connected between the reset level voltage Vreset. The dummy capacitor has a capacitance necessary to maintain the operation of the shift register, and requires a sufficient capacitance to absorb parasitic capacitance.

Therefore, with regards to the relationship between the circuit shown in FIG. 2 and the block diagram shown in FIG. 1, the transistor Q6 corresponds to the enable switch/buffer for performing the gate drive, and the other portions correspond to the shift register and the dummy capacitor.

The operation of the liquid crystal driving circuit will now be described with reference to the timing chart of FIG. 3.

The reset signal is applied to the gates of the transistors Q4, Q5, and Q7 to perform the reset in the configuration described above. But such transistors may be ignored in terms of operation since the reset is performed on all the lines to conduct together only once in each frame to discharge the unnecessary electric charges in the circuit in order to ensure the operation.

Figure 3:
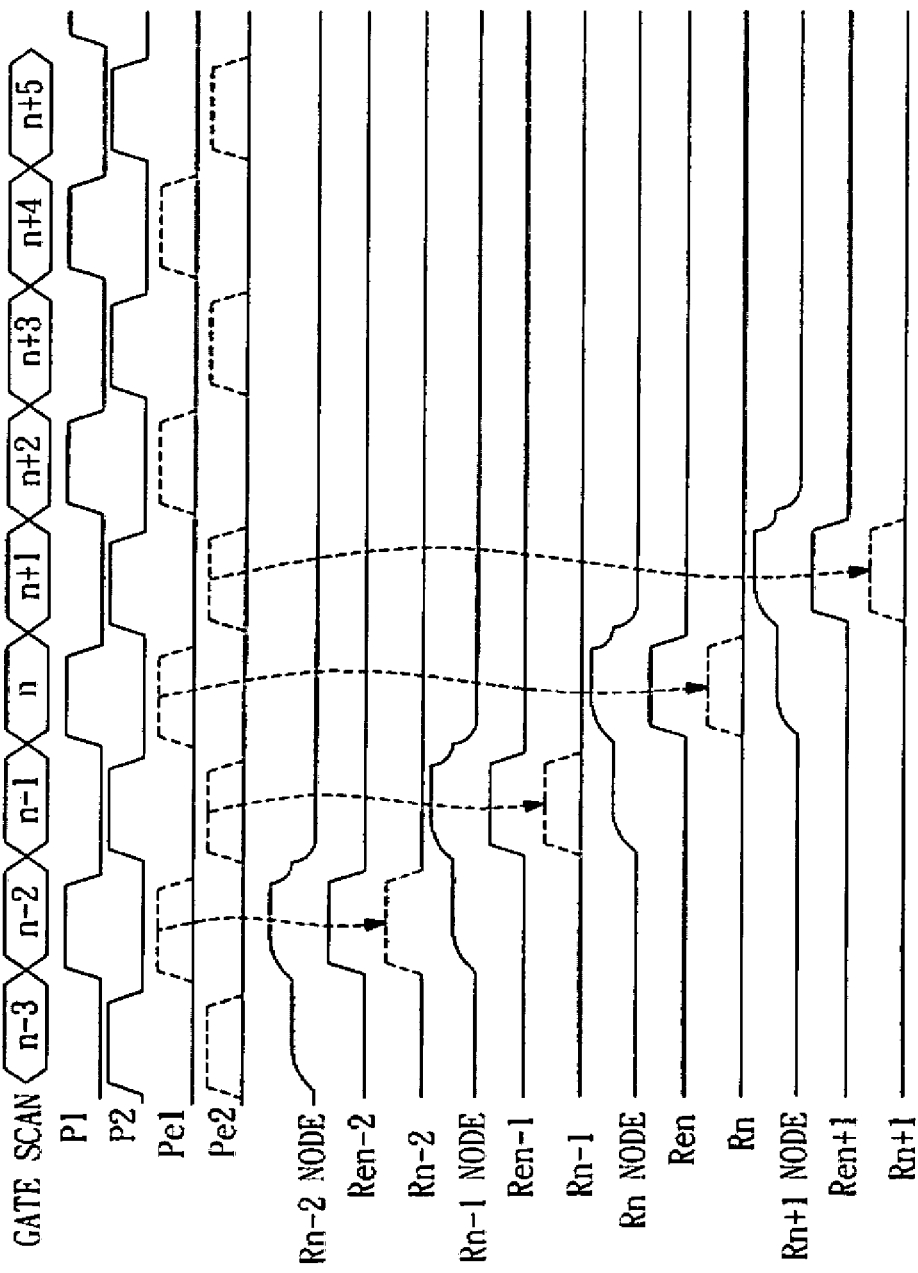
FIG. 3 is a timing chart explaining the operation in FIG. 2.

In FIG. 3, the solid line indicates a case of skipping the scan, and the broken line indicates a case of sequentially operating the shift register.

Focusing on the nth line as apparent from FIG. 2, since Rn−1 of one line before is required to obtain the outputs of the signal Rn and the enable output Ren of the nth line, consideration is made from the operation of one line before. The enable signal of the enable output Ren+1 in the next line is also input to the gate of the transistor Q2, but the transistor Q2 is in the OFF state since such signal is low in the nth line.

On the other hand, the transistor Q1 is turned ON since the enable output Ren−1 is high in one line before, and the Rn node rises to a voltage smaller from the high level by the threshold value voltage of the transistor Q1, and the transistors Q3 and Q6 are turned ON. The output signal Rn becomes high as the signal Pe1 on the enable line becomes high when performing the scan, whereas the output signal Rn is still in the low state even if the transistor Q6 is turned ON when skipping the scan since the pulse signal Pe of the enable line is not applied.

When skipping the scan, a scan pulse P1 is applied, and the transistor Q3 is turned ON, and thus the enable output Ren at the node NE1 becomes high, and the dummy capacitor Cd becomes charged. Simultaneously, the potential of the Rn node further increases at a fall timing of the Rn−1 node, as shown in FIG. 3, since the capacitor C2 and the transistor Q3 configure a bootstrap circuit. That is, the signal is obtained in which the level changes in two steps in the two periods of n−1th line and nth line.

The signals of two systems, P1 and P2, are prepared as the scan pulses to ensure the operation for each line. As apparent from FIG. 2, a inverted pulse invP is also used, which signal may be generated by arranging an inverting means in each shift register and forming an inverted signal, or preparing an independent signal providing line so as to act as the scan pulse.

In the latter case, a pair of forward and reverse signals are alternately retrieved for each line from the four signals P1, invP1, P2, and invP2 providing from corresponding supply lines.

Such relationship is for any similar two continuous periods, and similar operation is repeated for each line.

The shift register sequentially turns ON the node of each line by using the circuit of FIG. 2, but the drive of the relevant line is not performed and the display is also not performed unless the enable switch Q6 is turned ON. Therefore, partial drive of the liquid crystal becomes possible by advancing to the display start line with the shift register, and switching ON the enable switch.

High potential is supplied to the gate of each transistor only at a necessary timing. The pulse provided to the line of the pixel array via the enable switch is not applied to the gate of the transistor. This transistor configures the enable switch but is applied to the drain thereof with respect to Pe, and thus degradation of the transistor is suppressed even if the transistor is formed by amorphous silicon, and the life of the driving circuit can be extended.

Second Embodiment

Figure 4:
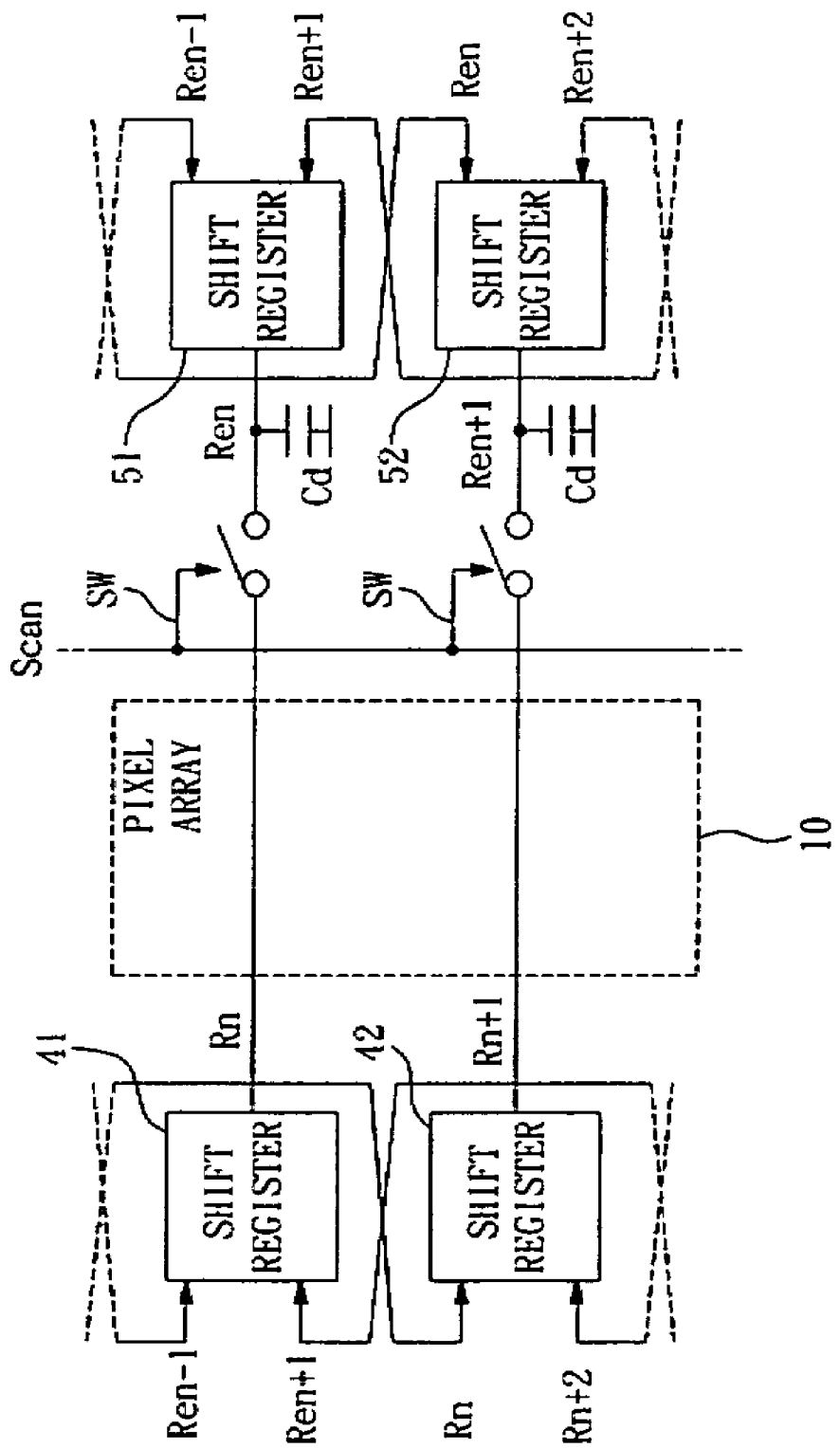
FIG. 4 is a block diagram showing a schematic configuration of a liquid crystal driving circuit according to a second embodiment of the present invention.
Figure 5:
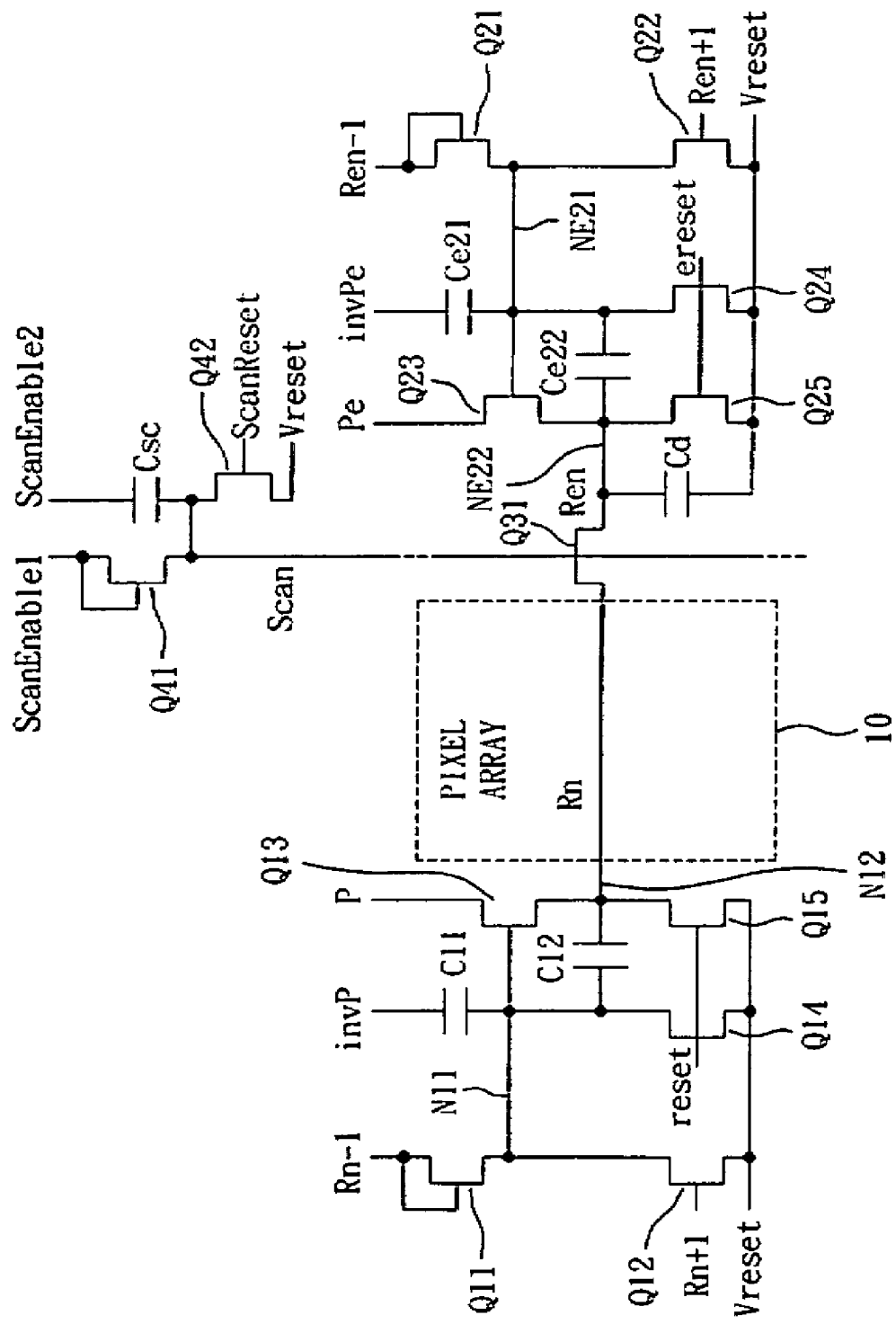
FIG. 5 is a circuit diagram showing the configuration of FIG. 4 in detail.
Figure 6:
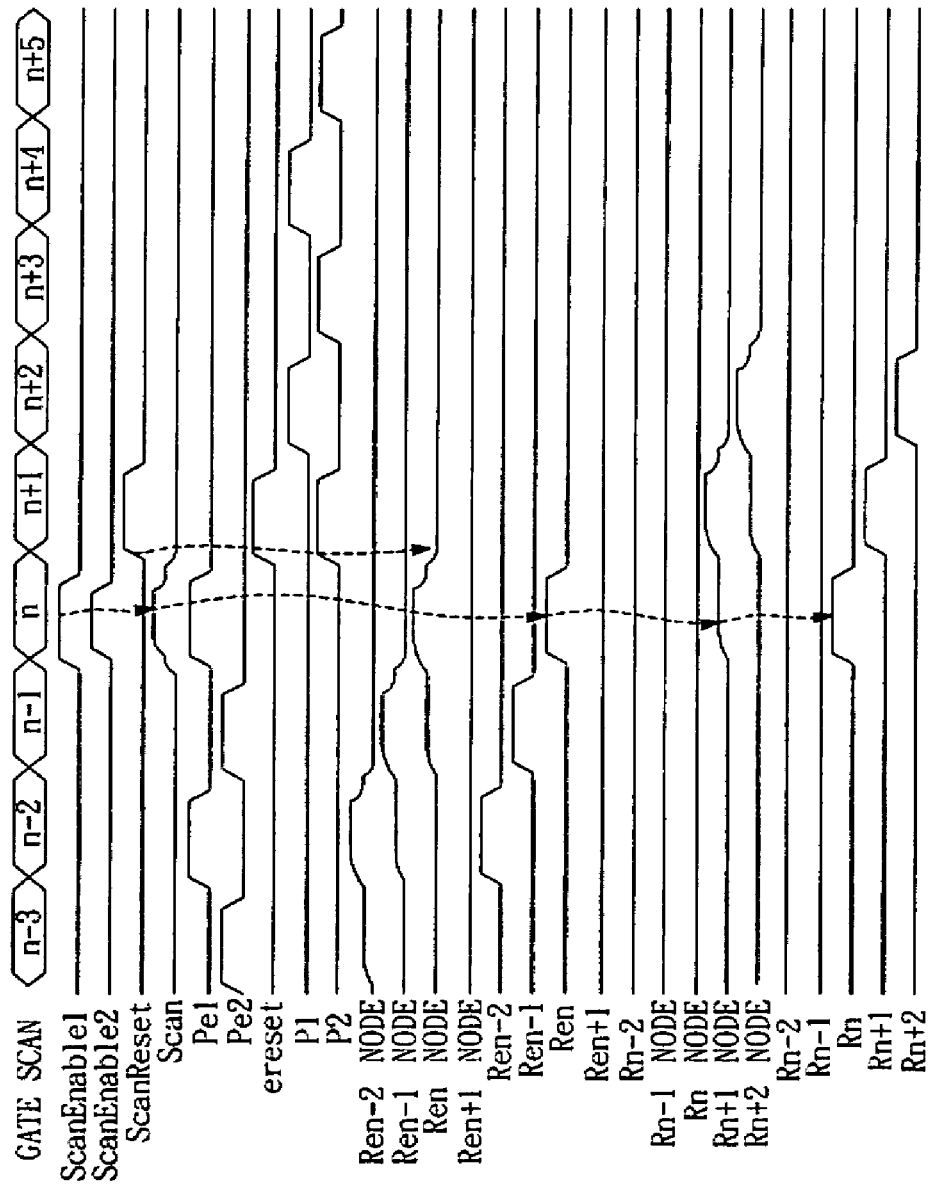
FIG. 6 is a timing chart explaining the operation in FIG. 5.

FIGS. 4 to 6 show the configuration and the operation according to a second embodiment of the liquid crystal driving circuit according to the present invention. FIG. 4 is a simplified view showing the configuration, which configuration differs from the configuration of FIG. 1 in that the shift registers are arranged on both sides of the liquid crystal pixel array 10 with one side for moving to the line to be displayed and the other side for providing the selective pulse to the gate line of the pixel array.

FIG. 4 shows the configuration for the two lines of n and n+1. The shift registers 51, 52 on the right side are a second shift register for advancing through the lines. The registers 41, 42 on the left side are a first shift register for the pixel array 10 to perform the line drive. A switch SW is arranged adjacent to the pixel array 10 for connecting the output line of the second shift register and the output line of the first shift register according to the scan signal.

FIG. 5 is a circuit diagram specifically showing the configuration of FIG. 4, describing the configuration of the nth line, but other lines also have a similar configuration.

The shift register including five transistors Q11 to Q15 on the left side have exactly the same configuration in terms of circuit as the shift register portion including the transistors Q1 to Q5 described in FIG. 2. Thus, the transistors are corresponded with the reference characters in the tens. However, the configuration differs in that the signal to be input is signals Rn−1 and Rn+1, which are the outputs of the shift registers of the previous line and the next line, instead of the enable signals on the enable outputs Ren−1 and Ren+1 of FIG. 1, and the obtained output is only signal Rn.

The shift register including the five transistors Q21 to Q25 on the right side have exactly the same configuration in terms of circuit including the dummy capacitor Cd and the shift register portion including the transistors Q1 to Q5 described in FIG. 2. Thus, the transistors are corresponded with the reference characters in the twenties. However, those corresponding to capacitors C1, C2 of FIG. 2 are denoted as Ce21 and Ce22 since they relate to the enable signal.

The configuration differs greatly from the configuration of FIG. 2 in that, on the right side, the output signal Rn of the shift register on the left side is connected to one terminal of the transistor Q31 acting as the enable switch after being provided to the pixel array 10, and the enable output Ren, which is the output of the shift register on the right side, is connected to the other end of the transistor Q31, and a scan signal for performing the scan on the pixel array is provided to the gate of the switch transistor.

The circuit configuration for generating the scan signal has the gate line connecting to the gates of each line. The gate line is connected to the drain of the transistor Q41. The source and the gate of the transistor Q41 are connected. A Scan Enable 1 signal is provided to the source of the transistor Q41, and the source of the transistor Q41 is connected to the connecting point of a capacitor Csc and a source of the transistor Q42. Furthermore, the Scan Enable 2 signal is provided to the other end of the capacitor Csc, the reset level voltage Vreset potential is applied to the drain of the transistor Q42, and a Scan Reset signal for resetting the scan is applied to the gate.

The operation of the circuit will now be described using the timing chart of FIG. 6.

Resetting of each shift register is performed at the beginning of each frame. The shift register on the right side is first operated to advance to the desired line address. Assuming line n is reached, the node NE22 is at a level increased by two steps by the bootstrap action, the enable signal of the enable output Ren is generated, and the dummy capacitor is being charged.

With the line n as the start line of the partial drive, the Scan signal level rises via the diode connected transistor Q41 when the Scan Enable 1 signal becomes high. Subsequently, when the Scan Enable 2 signal becomes high during the period the Scan Enable 1 signal is high, the capacitor Csc for scanning is charged and the electric charge in the capacitor is added to the Scan signal, whereby the scan signal increases in two steps.

The transistor Q31 is then electrically conducted, and the voltage level that appears at the node NE 22 acts as the signal Rn for driving the line n of the pixel array.

When the value of the signal Rn is determined, such value is sent to the shift register of the next line, which is also provided with pulses P1 and P2, and thus the shift register on the left side sequentially advances through the lines, the drive of the pixel array is performed thereby realizing partial drive.

Therefore, when the line address to be partially driven is reached by the shift register on the right side, the output thereof acts as the signal for driving the pixel array, and thereafter, the shift register on the left side sequentially drives the lines of the pixel array, thereby realizing partial drive.

In order to stop the partial drive, the Scan Reset signal is provided to turn OFF the transistor Q31, and the signal reset is provided in the shift register on the right side to lower the potential of the enable output Ren thereby stopping the supply of signal Rn to the next line. The operation of the shift register on the left side is thus completely stopped in the next two lines, as apparent from FIG. 6.

By adopting such configuration, similar to the first embodiment, high voltage does not need to be continuously applied to the gate of the transistor configuring the shift register, degradation of the amorphous silicon transistor is prevented, and the liquid crystal display device having high space efficiency can be realized in applications of devices where a great amount of restrictions are made on the space, in particular, portable telephones and the like since two shift registers are arranged on both sides of the liquid crystal display screen.

Third Embodiment

A third embodiment of the liquid crystal driving circuit according to the present invention will now be described with reference to FIGS. 7 to 9.

Figure 7:
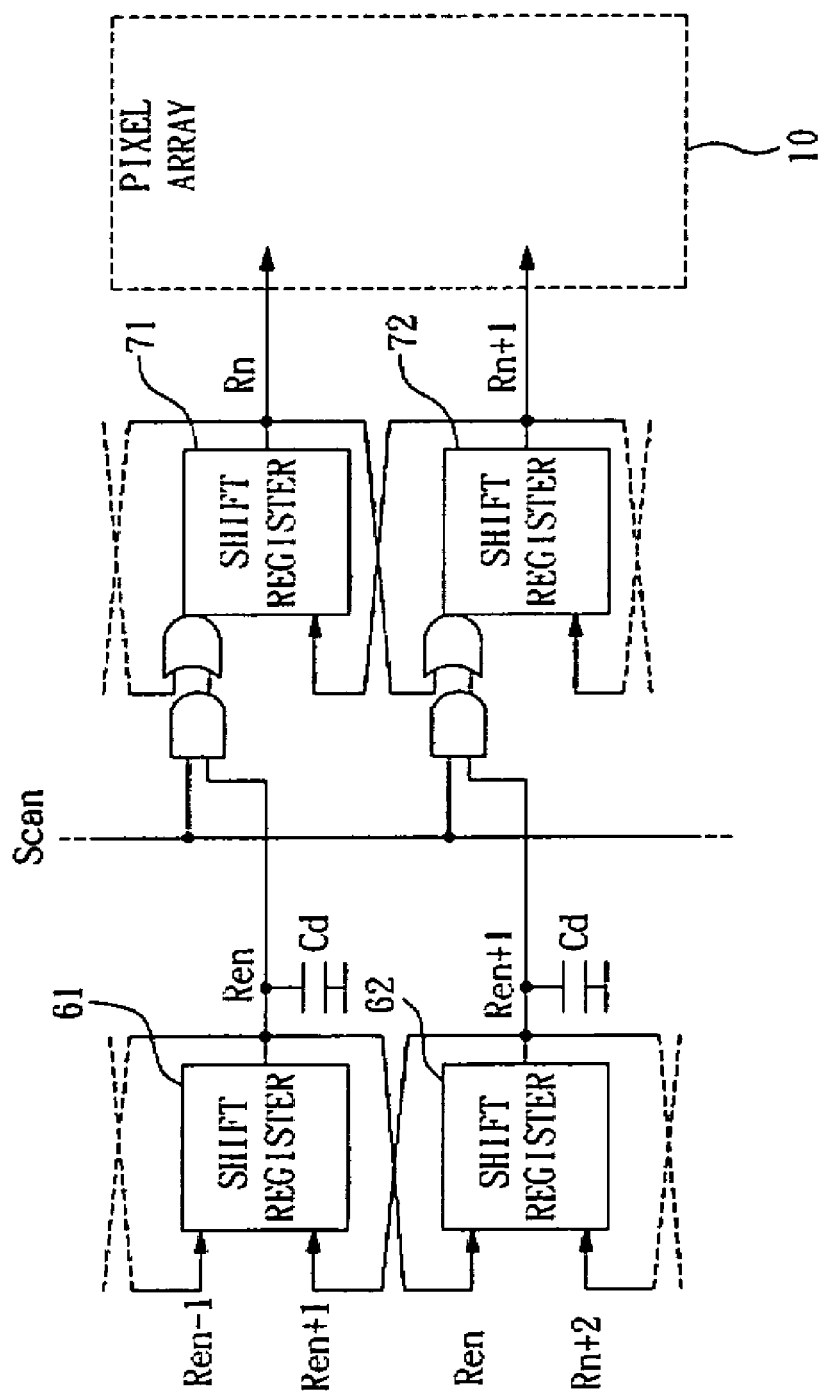
FIG. 7 is a block diagram showing a schematic configuration of a liquid crystal driving circuit according to a third embodiment of the present invention.

FIG. 7 is a view showing a schematic configuration of the third embodiment of the liquid crystal driving circuit according to the present invention, showing the nth and the n+1th lines, similar to the other embodiments. The first shift register on the left side indicated by reference characters 61 and 62 is a shift register for advancing to a desired address line. Two second shift registers indicated by reference characters 71, 72 are further provided for outputting the signal for line driving the pixel array 10 by the output of the OR gate. The output of an OR gate is a logical product of an output of an AND gate and the enable signal from the previous line. The output of the AND gate is a logical sum of the output of the first shift register and the Scan signal for validating the scan. This circuit supplies high driving voltage to the pixel array using the signal for validating the scan and the enable signal. The logical sum gate AND and the logical product gate OR are shown in FIG. 7, but are merely functionally shown.

Figure 8:
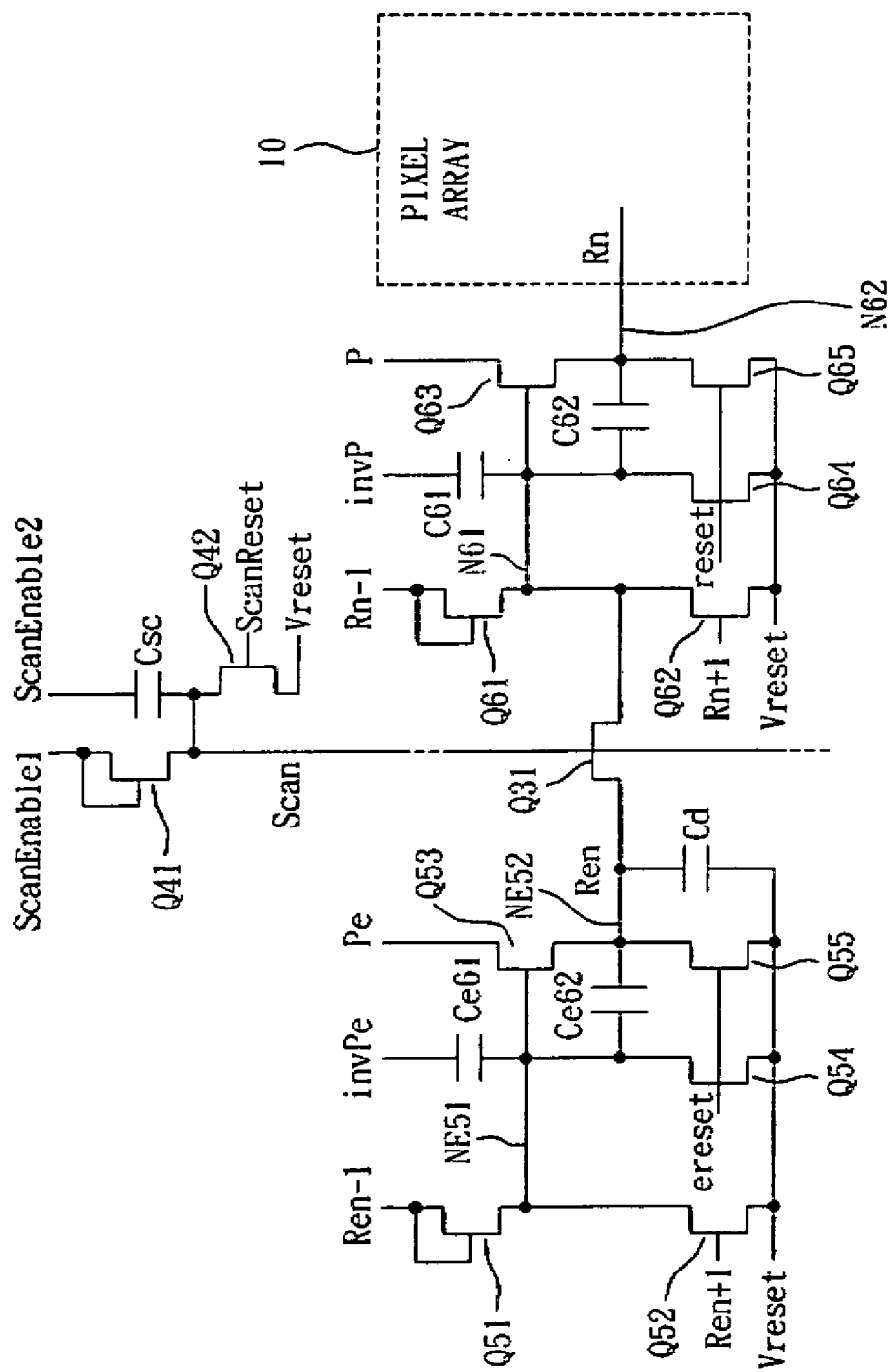
FIG. 8 is a circuit diagram showing the configuration of FIG. 7 in detail.
Figure 9:
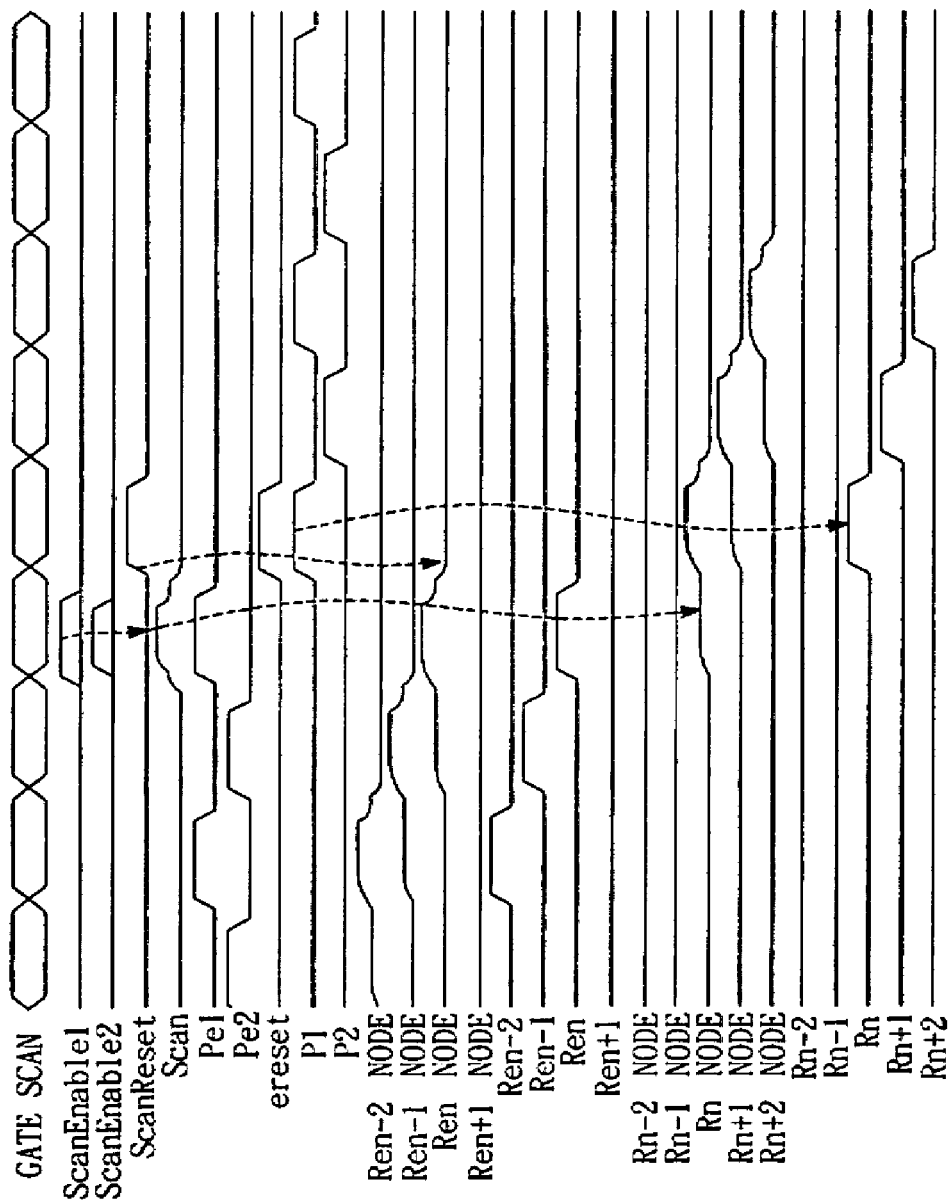
FIG. 9 is a timing chart explaining the operation in FIG. 8.

A specific circuit is shown in FIG. 8. The configuration for line n is shown, but other lines also have a similar configuration.

The portion corresponding to the first shift register configured by five transistors Q51 to Q55 generates the enable signal of the enable output Ren, but has exactly the same configuration in terms of circuit as the shift register portion of FIG. 2 configured by transistors Q1 to Q5 excluding the portion for outputting signal Rn. Thus, the transistors are corresponded with the reference characters in the fifties. Therefore, according to exactly the same operation described in FIG. 2, sequential empty scan is performed, and the enable signal of the enable output Ren for enabling the relevant line when the relevant line is reached is output.

The enable output Ren is connected to the enable switch Q31 of the same configuration as shown in FIG. 5, where the other end of the transistor acts as the input end of the second shift register. The circuit configuration for generating the scan signal with respect to the gate of the enable switch of each line is exactly the same as FIG. 5, and thus the same reference characters are denoted and the explanation thereof is not repeated.

The second shift register on the other side of the enable switch Q31 also has substantially the same configuration as the first shift register, but the enable output Ren provided through the enable switch Q31 is connected to the node N61, which is the connecting point of the drain of the transistor Q61 and the source of the transistor Q62. The output signal Rn for driving the relevant line of the pixel array 10 is obtained by the second shift register.

The operation of the configuration of FIG. 8 will now be described with reference to the timing chart of FIG. 9.

In the first shift register, the signal for validating the relevant line is output for each line, and the level of the enable signal of the enable output Ren raised by two steps is generated at node NE52 for the nth line. However, since the signal Ren of such level does not affect the second shift register unless the enable switch Q31 is turned ON, a so-called empty scan is performed.

The transistor Q31 is turned ON when the relevant line is provided with the Scan Enable 1 signal and the Scan Enable 2 signal as described using FIG. 6 for the configuration of FIG. 5, and the enable output Ren is applied to the inner node N61 of the second shift register, as described above. The node N61 is the inner terminal of the circuit and thus has high impedance. The output signal Rn−1 of the previous line is provided to the node via the transistor Q61, and is raised in two steps by the bootstrap action of the capacitor C62 and the transistor Q63, and thus a large voltage of about 15V and the like is generated at the node N62, whereby the pixel array can be driven from the relevant line.

In the present embodiment, since the enable output is obtained at the first shift register and is connected to the second shift register by way of the enable switch only when scan instruction is made, and the line drive signal is generated by the action of the second shift register, the partial drive is easily realized. Furthermore, since high voltage is applied to the gate of the transistor only during a limited time, degradation is significantly suppressed even in the transistor formed by amorphous silicon and thus stable drive operation is realized over a long period of time.

In each of the above embodiment, each shift register has substantially the same configuration, but variants and the like having similar effect may be applied.

What is claimed is:

1. A liquid crystal driving circuit comprising:
   a first shift register for advancing through the line address of a pixel array to display an image, and outputting an enable signal only to drive the display target line; and
   a driving means electrically connected to the first shift register and the line for outputting a line drive signal corresponding to the enable signal to drive the line enabled by the first shift register,
   wherein the driving means includes a second shift register and an enable switch, the second shift register receives a signal outputted from a shift register of the previous line and a signal outputted from a shift register of the next line, and outputs the line drive signal for the pixel array, and the enable switch is connected to the first shift register and the second shift register.

2. The liquid crystal driving circuit according to claim 1, wherein the driving means is arranged on one side of the pixel array.

3. The liquid crystal driving circuit according to claim 1, wherein
   the second shift register arranged on the opposite side of the pixel array with respect to the first shift register, and
   the enable switch arranged on the same side as the first shift register.

4. The liquid crystal driving circuit according to claim 1, wherein the first shift register has an auxiliary capacitor connected to the enable output line.

5. The liquid crystal driving circuit according to claim 1, wherein the first shift register includes a bootstrap circuit configured by a transistor and a capacitor connected between the gate and the drain of the transistor for obtaining the enable output of the line that changes in steps based on the enable output of a previous line.

6. The liquid crystal driving circuit according to claim 1, wherein the liquid crystal driving circuit is formed on a glass substrate.

7. The liquid crystal driving circuit according to claim 1, wherein a transistor configuring the liquid crystal driving circuit is formed by amorphous silicon.

8. A liquid crystal display device comprising a liquid crystal driving circuit according to claim 1, and a pixel array driven by the liquid crystal driving circuit.

* * * * *